United States Patent
Kumagai et al.

Patent Number: 5,257,415
Date of Patent: Oct. 26, 1993

[54] AUTOMATIC TRANSMISSION LEVEL CONTROL DEVICE

[75] Inventors: Yoshiaki Kumagai; Eiji Itaya; Yoichi Endo, all of Kawasaki, Japan

[73] Assignee: Fujitsu Limited, Kawasaki, Japan

[21] Appl. No.: 851,614

[22] Filed: Mar. 16, 1992

[30] Foreign Application Priority Data

Mar. 20, 1991 [JP] Japan ................... 3-057302
Mar. 20, 1991 [JP] Japan ................... 3-082020

[51] Int. Cl.⁵ .................................. H04B 1/04
[52] U.S. Cl. .................................. 455/126; 455/115
[58] Field of Search ............. 455/59, 103, 104, 115, 455/119, 126, 127, 13.4; 330/84, 294, 124 R, 126

[56] References Cited

U.S. PATENT DOCUMENTS

5,119,042 6/1992 Crampton et al. .............. 455/126

FOREIGN PATENT DOCUMENTS

| 0163729 | 7/1986 | Japan | 455/115 |
| 0048524 | 2/1989 | Japan | 455/119 |
| 0143719 | 6/1990 | Japan | 455/119 |
| 2-143719 | 6/1990 | Japan | |

Primary Examiner—Reinhard J. Eisenzopf
Assistant Examiner—Chi Pham

[57] ABSTRACT

An automatic transmission level control device used in a multi-carrier communication system includes a gain controller for controlling a level of a transmission signal, a transmitter for amplifying the transmission signal, and a hybrid circuit for extracting a part of power of the transmission signal from the transmitter. A level control circuit adjusts a gain of the gain controller on the basis of a magnitude of the transmission signal and data indicating a number of carriers included in the transmission signal. A carrier detection unit filters the transmission signal and generates the data indicating the number of carriers included therein.

14 Claims, 12 Drawing Sheets

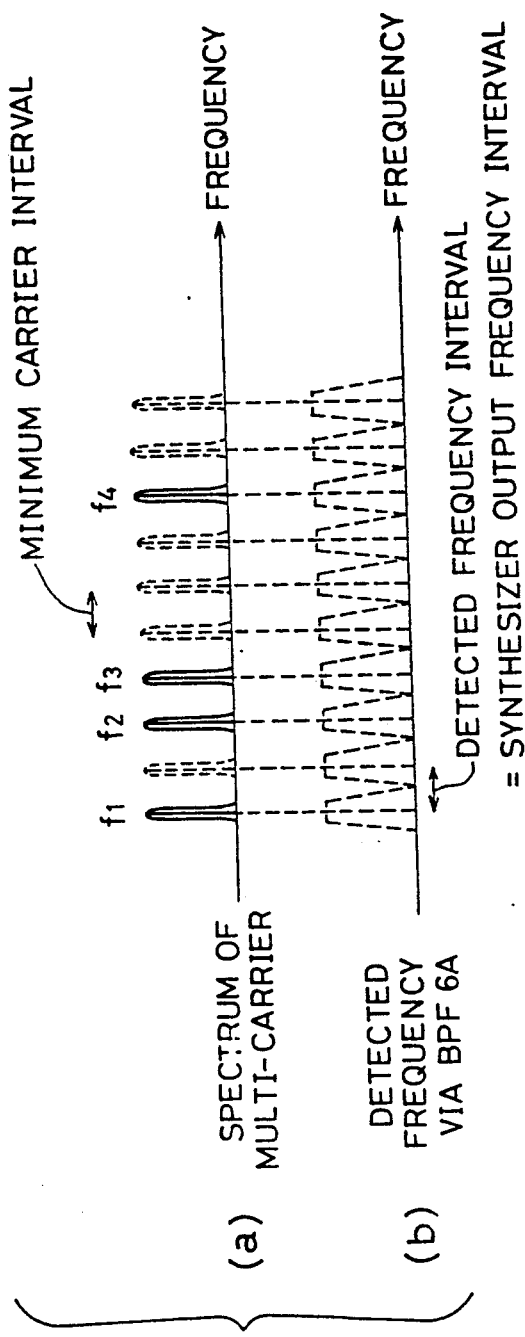

AUTOMATIC TRANSMISSION LEVEL CONTROL DEVICE

BACKGROUND OF THE INVENTION (1) Field of the Invention

The present invention generally relates to an automatic control of a transmission power in a radio device, such as a satellite communication device. More particularly, the present invention is concerned with an automatic transmission level control device used in a multi-carrier radio communication device.

(2) Description of the Prior Art

Recently, there has been a demand to efficiently use frequencies and transmission power in the field of radio communication devices and satellite communication devices. For the above demand, there has been proposed an SCPC (Single Channel Per Carrier) system having a carrier ON/OFF function, or a multi-carrier TDMA (Time Division Multiple Access) system. These systems use a plurality of carriers, and the number of carriers are dynamically changes on the basis of the number of communications. In these systems, it is desired to provide a transmission power automatic control process which makes it possible to keep the communication channels in the stable state and realize stable communications.

FIG. 1 shows a conventional automatic transmission level control device of a multicarrier communication device. The device shown in FIG. 1 comprises a gain controller 1, a transmitter 2 having a converter and a high power amplifier (HPA), and a hybrid circuit (H) 3 for extracting a part of power of a transmission signal output by the transmitter 2. The gain controller 1, the transmitter 2 and the hybrid circuit 3 form a high-frequency part of the communication device. The device shown in FIG. 1 further comprises a detector (DET) 4 and a control circuit (CNTL) 5. The detector 4 detects the signal from the hybrid circuit 3 and generates a DC voltage based on the detected signal. The control circuit 5 controls the gain of the gain controller 1 on the basis of the DC voltage generated by the detector 4 and information indicative of the number of carriers supplied from a terminal equipment (not shown for the sake of simplicity).

In the multicarrier communication system, the number of carriers is dynamically changed on the basis of the number of communications, as has been described previously. In the conventional multi-carrier communication device, the gain controller 1 is not controlled by only the magnitude of the output signal from the transmitter 2, but taking into account the information indicative of the number of carriers supplied from the terminal equipment. Hence, it becomes possible to generate an output signal of the transmitter 2 based on the number of carriers. As a result, it becomes possible to prevent a change in power of each carrier based on a change in the number of carriers from being recognized to be a simple level variation and keep the transmission level equal to an appropriate level.

As described above, it is necessary to obtain, from the terminal equipment, information indicative of the number of carriers. In order to transfer the above information to the automatic transmission level control device by means of a parallel transmission system, it is necessary to use control lines equal in number to carriers. If a serial transmission system is used to transfer the above information, it is necessary to use a parallel-serial conversion circuit although a single control line can be used. If the information about the number of carriers is transmitted in digital form, it is necessary to simultaneously transfer four bits in a case where nine carriers can be used at maximum.

In practical transmission systems, the high-frequency part including, as a major part, the transmitter, is installed in a place remote from a place where the terminal equipment having modulators and demodulators is installed. For example in a very-small satellite terminal (VSAT) system, the high-frequency part is placed outdoors together with an antenna, and the terminal equipment is placed indoors. In some cases, the distance between the high-frequency part and the terminal equipment is equal to 100 to 200 meters. In the parallel transmission system, it is very expensive to provide a plurality of cables between the high-frequency part and the terminal equipment. The serial transmission system is less expensive than the parallel transmission system because only one cable can be used. However, the serial transmission system needs the parallel-to-serial converter, as has been described previously. Hence, the serial transmission system has a complex hardware structure. In addition, use of the parallel-to-serial converter increases the cost of building up the system. It may be possible to superimpose carriers on signals in the serial transmission system. However, for this purpose, there is a need for a modulator and a hybrid circuit.

SUMMARY OF THE INVENTION

It is a general object of the present invention to provide an automatic transmission level control device in which information indicating the number of carriers can be obtained at the high-frequency part without receiving the information from the terminal equipment and the transmission level can be automatically controlled on the basis of the information obtained at the high-frequency part.

The above object of the present invention is achieved by an automatic transmission level control device used in a multi-carrier communication system, comprising: gain control means for controlling a level of a transmission signal; transmission means, coupled to the gain control means for amplifying the transmission signal; hybrid circuit means, coupled to the transmission means, for extracting a part of power of the transmission signal from the transmission means; level control means, coupled to the gain control means and the hybrid circuit means, for adjusting a gain of the gain control means on the basis of a magnitude of the transmission signal and data indicating a number of carriers included in the transmission signal; and carrier detection means, coupled to the hybrid circuit means and the level control means, for filtering the transmission signal and for generating the data indicating the number of carriers included therein.

BRIEF DESCRIPTION OF THE DRAWINGS

Other objects, features and advantages of the present invention will become more apparent from the following detailed description when read in conjunction with the accompanying drawings, in which:

FIG. 15 is a diagram showing the operation of the fourth embodiment of the present invention;

DESCRIPTION OF THE PREFERRED EMBODIMENTS

Figure 1:
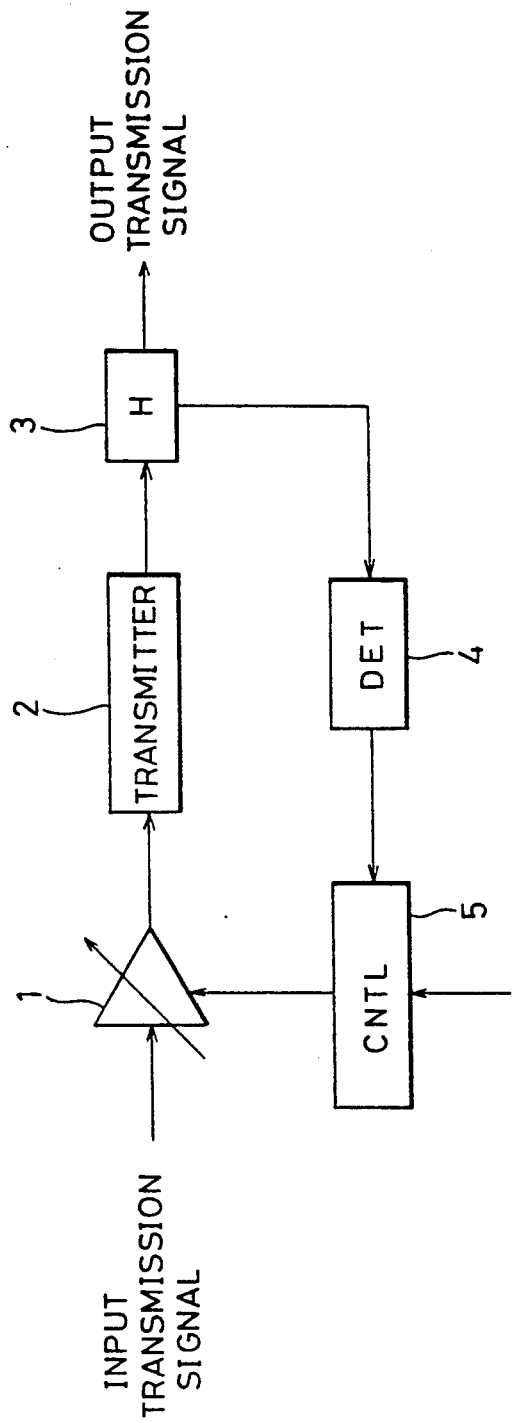
FIG. 1 is a block diagram of a conventional automatic transmission level control device used in a multi-carrier system.
Figure 2:
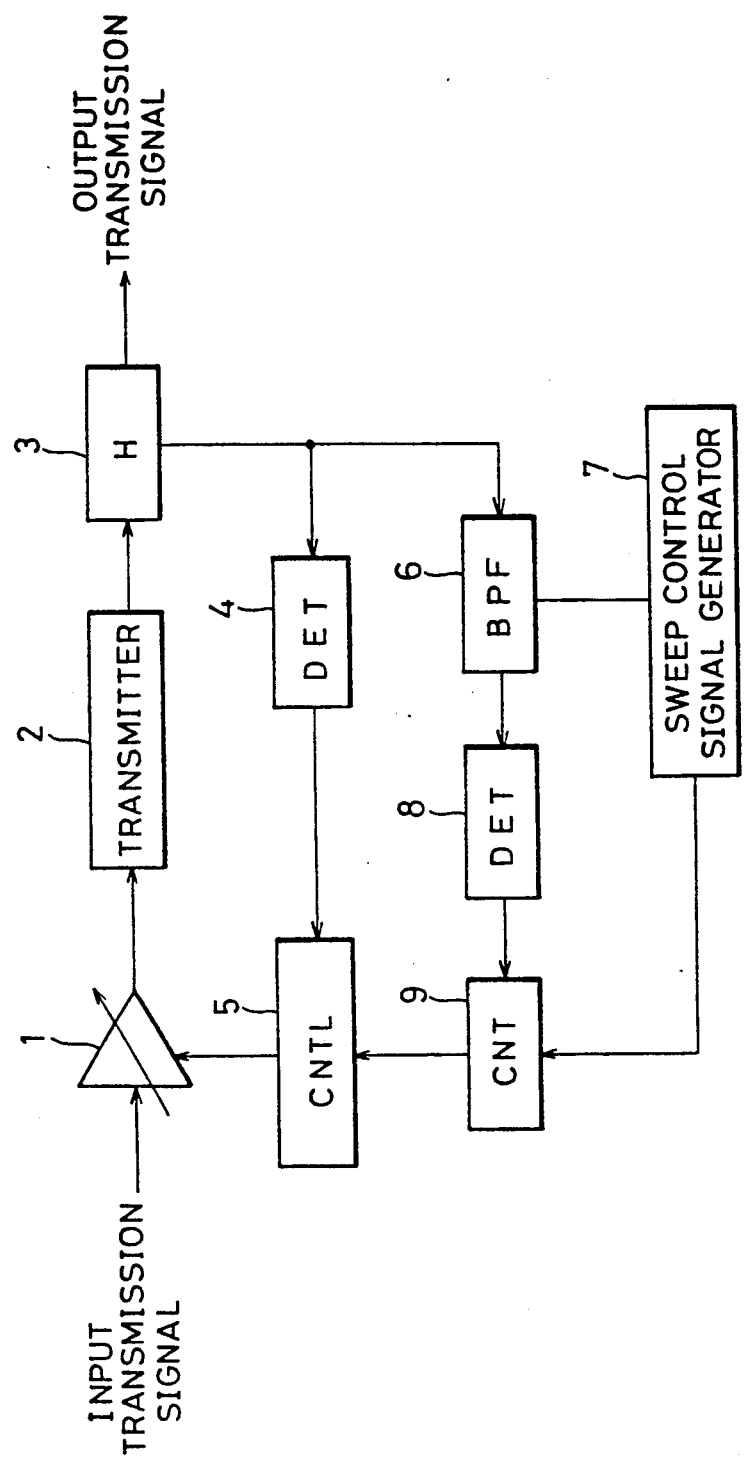
FIG. 2 is a block diagram of a first embodiment of the present invention.

FIG. 2 shows an automatic transmission level control device according to a first embodiment of the present invention. In FIG. 2, parts which are the same as those shown in FIG. 1 are given the same reference numerals. The device shown in FIG. 2 includes a high-frequency part, which is made up of the gain controller 1, the transmitter 2 and the hybrid circuit 3 in the same manner as shown in FIG. 1. The device shown in FIG. 2 includes the detector 4 and the control circuit 5 as in the case of the device shown in FIG. 1. According to the first embodiment of the present invention, a bandpass filer (BPF) 6 having a variable central frequency, a sweep control signal generator 7, a second detector (DET) 8 and a counter (CNT) 9.

The bandpass filter 6 has a narrow frequency range and a variable central frequency, and is controlled by a sweep control signal generated by the sweep control signal generator 7, as will be described later. The bandpass filter 6 passes only a band width equal to one carrier in a signal frequency range. The sweep control signal generator 7 generates the above sweep control signal which changes the central frequency of the filter 6 at predetermined intervals. Further, the sweep control signal generator 7 outputs a signal indicative of one period to the counter 9. The detector 8 generates a pulse when detecting the signal passing through the filter 6. The counter 9 counts the number of pulses from the detector 8 during each period during which the central frequency is successively changed from the lowest frequency of the sweep range to the highest frequency thereof. The bandpass filter 6, the sweep control signal generator 7, the detector 8 and the counter 9 are placed near the high-frequency part. A part of the transmission signal from the transmitter 2 is extracted by the hybrid circuit 3, and applied to the detector 4 and the bandpass filter 6. The detected voltage is generated by the detector 4, and output to the control circuit 5. The central frequency of the landpass filter 6 is successively changed within the entire sweep range during a predetermined period. Hence, each of the carriers is allowed to pass through the filter 6 only one time and then detected by the detector 8. Thus, the detector 8 generates pulses equal in number to the existing carriers during one sweep period of the filter 6. The counter 9 counts the number of pulses output by the detector 8. The number of pulses is equal to the number of existing carriers. It will be noted that information indicating the number of carriers can be generated without receiving it from the remote terminal equipment.

Figure 3:
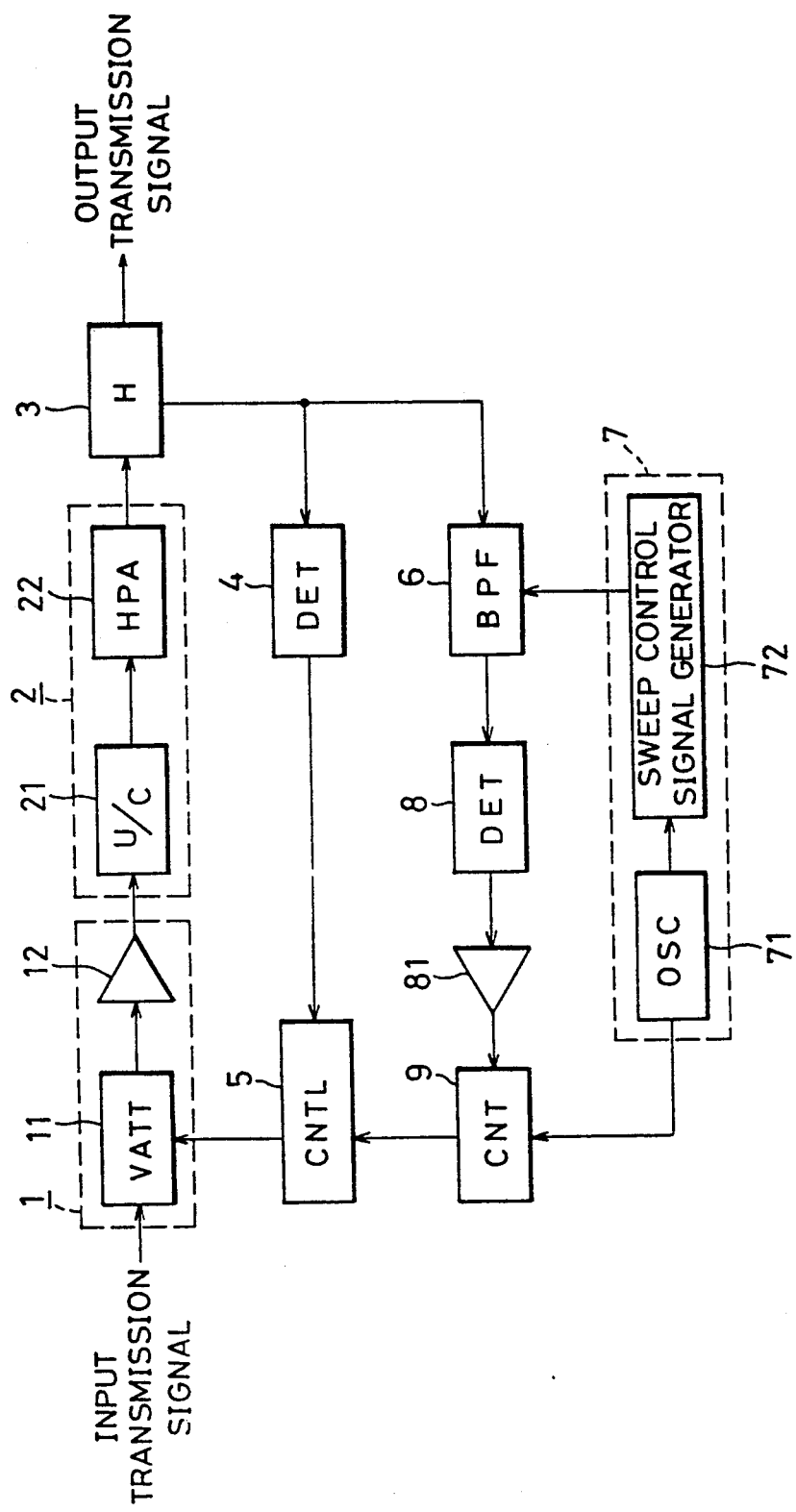
FIG. 3 is a block diagram of the first embodiment of the present invention in more detail.

FIG. 3 shows the structure shown in FIG. 2 in more detail. In FIG. 3, parts which are the same as those shown in the previous figures are given the same reference numerals. The gain controller 1 is composed of a variable attenuator (VATT) 11 having a variable attenuation level based on an applied voltage, and an amplifier 12. The transmitter 2 is composed of an up converter (U/C) 21, and a high-gain power amplifier 22. The sweep control signal generator 7 is composed of an oscillator (OSC) 71 and a sweep control signal generator (GEN) 72. The oscillator 71 generates a rectangular wave. In synchronism with the rectangular wave, the sweep control signal generator 7 generates a sawtooth wave for sweeping the sweep range in which the central frequency of the bandpass filter 6 is successively changed. The detector 81 amplifies the output signal of the detector 8. An amplified output signal from the amplifier 81 is applied to the counter 9.

Figure 4:
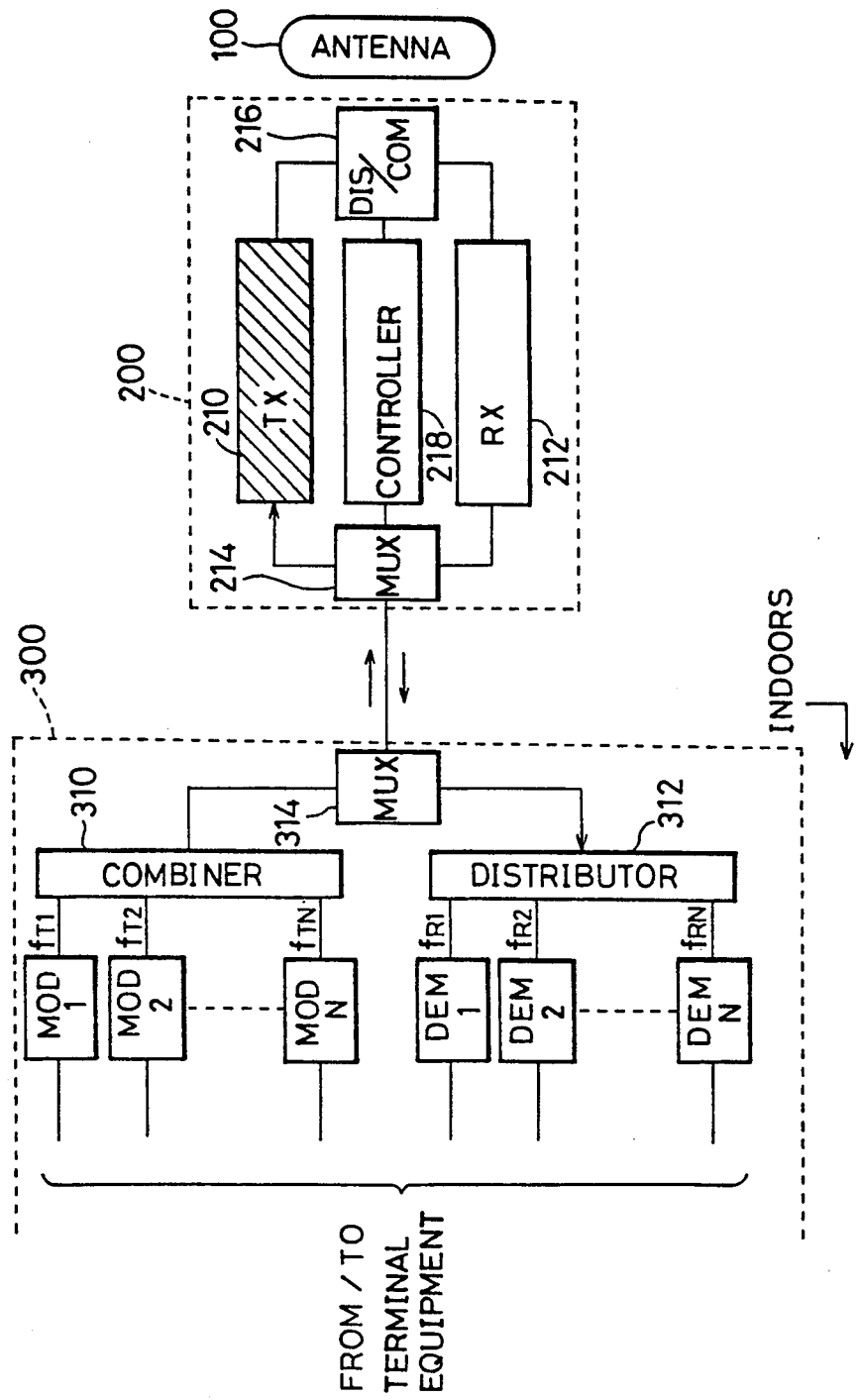
FIG. 4 is a block diagram of a communication system in which the present invention is embedded.

FIG. 4 is a block diagram of a very-small satellite communication system in which the present invention is embedded. The system shown in FIG. 4 comprises an antenna 100, a transmitter/receiver device 200, and a terminal station 300. The transmitter/receiver device 200 is composed of a transmitter device (TX) 210, a receiver device (RX) 212, a multiplexer (MUX) 214 and a combiner 310, a hybrid circuit 312, a multiplexer 314, a plurality of modulators MOD-1-MOD-N, and a plurality of demodulators DEM-1-DEM-N. The transmitter/receiver device 200 is placed near the antenna 100, and the terminal station 300 is installed indoors. The transmitter/receiver device 200 and the terminal station 300 are connected to each other by a cable. Information which is to be transmitted and control signals are sent to the transmitter/receiver device 200 from the terminal station 300. Received information and supervisory information are sent to the terminal station 300 from the transmitter/receiver device 200.

The modulators MOD-1-MOD-N use respective carriers $f_{T1}$-$f_{TN}$ having mutually different frequencies. The distributor 312 generates respective carriers $f_{R1}$-$f_{RN}$ having mutually different frequencies. A change in the number of carriers is caused due to the fact that the modulators MOD-1-MOD-N send the respective carriers at a time interval in which signals (speed signal and packet data, for example) to be transmitted exist.

The automatic transmission level control device shown in FIG. 3 is provided in the transmitter device 210.

Figure 5:
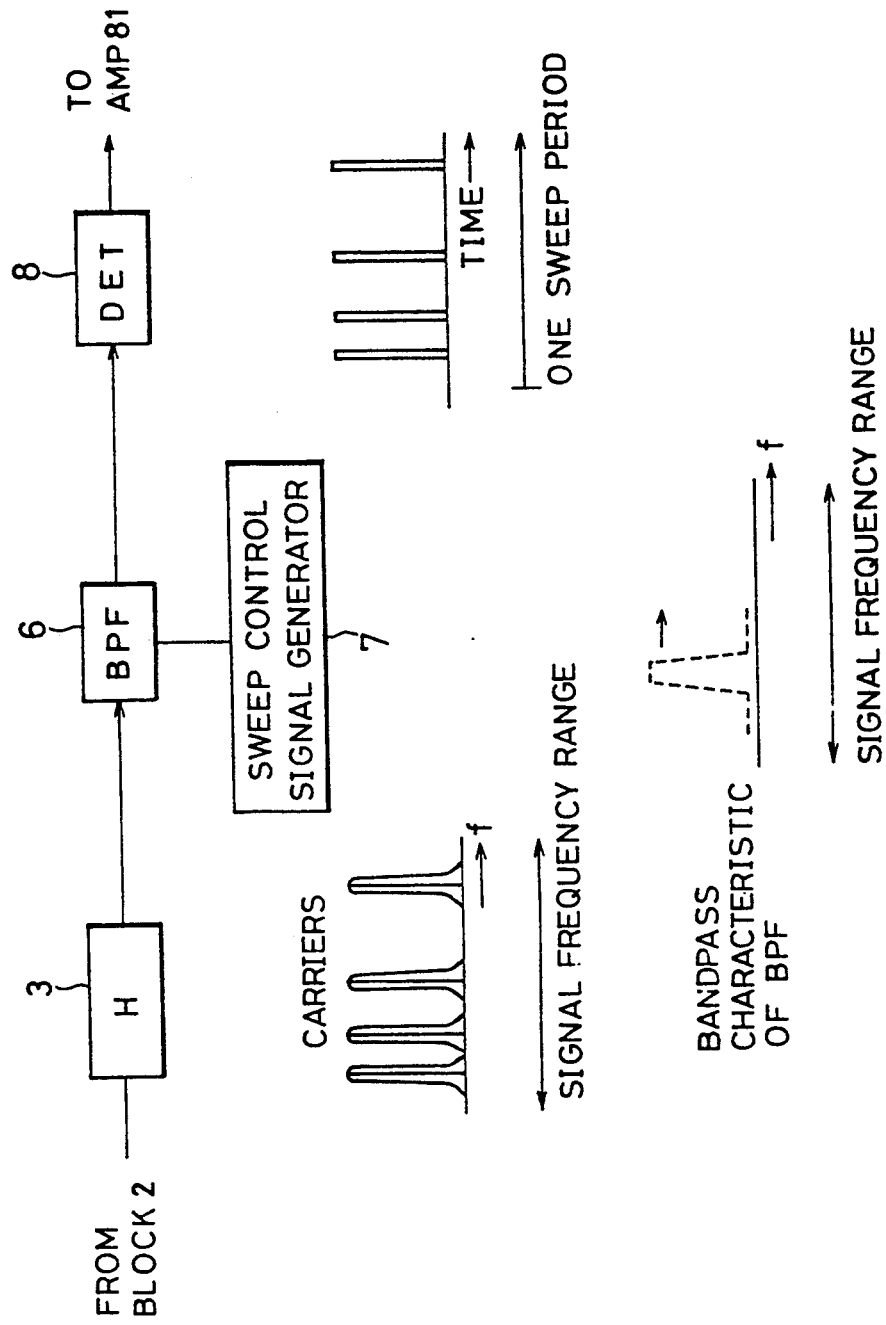
FIG. 5 is a diagram showing the operation of the first embodiment of the present invention.
Figure 6:
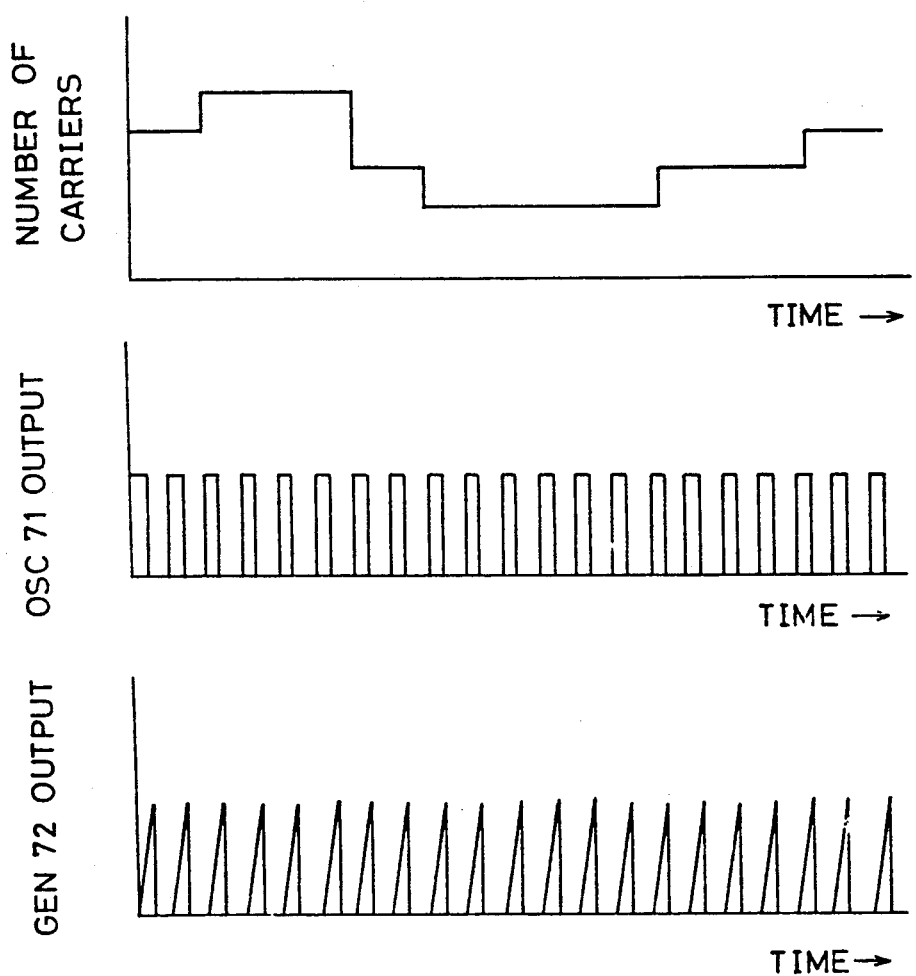
FIG. 6 is a waveform diagram showing the operation of the first embodiment of the present invention.

FIG. 5 is a diagram showing the operation of the device shown in FIG. 3. FIG. 6 shows a change in the number of carriers, and the operations of the oscillator 71 and the sweep control signal generator 72. As shown in FIG. 6, the generator 72 generates a sawtooth wave in synchronism with the rectangular wave generated by the oscillator 71. One period of the rectangular wave is shorter than a minimum period during which the number of carriers changes does not occur.

A process of detecting the number of carriers will now be described in short with reference to FIG. 5, which shows the operation of the device shown in FIG. 3 when four carriers out of a plurality of carriers are used. The four carriers have mutually different frequencies. A part of the transmission signal containing carriers is extracted from the hybrid circuit 3, and applied to the bandpass filter 6. The sawtooth wave is periodically applied to the bandpass filter 6. In response to the sawtooth wave, the bandpass range of the bandpass filter 6 is moved from the lowest frequency end of the signal frequency range to the highest frequency end thereof. The bandpass range of the bandpass filter 6 is a narrow range in which only one carrier is allowed to pass. In other words, the bandpass range of the bandpass filter 6 is approximately equal to the width of one carrier. When the bandpass range of the bandpass filter 6 becomes equal to that of an existing carrier, the bandpass filter 6 generates a pulse signal. In the above manner, the bandpass filter 6 generates four pulse signals in response to the four carriers shown in FIG. 5.

The detector 8 detects the pulse signal output by the bandpass filter 6, and generates one-shot pulses in response to the pulse signals. The pulses output by the detector 6 is amplified and applied to the counter 9. The counter 9 counts the number of pulses from the amplifier 81 for each cycle of the rectangular wave generated by the oscillator 71. The control circuit 5 changes a reference level used for controlling the transmission level on the basis of the detected number of carriers. The changed level is applied to the variable attenuator 11. In the above manner, a transmission level suitable for the number of carriers can be determined.

In order to correctly detect the number of carriers and adjust the reference transmission level on the basis of the detected number of carriers, it is necessary for the control circuit 5 to always have information indicative of the number of carriers which is equal to the real number of carriers. For this requirement, the latest information indicative of the number of carriers must be obtained during one sweep period. That is, the time it takes for the bandpass range of the bandpass filter 6 to move from the lowest frequency end thereof to the highest frequency end must be equal to or shorter than a minimum period during which the number of carriers does not change. The minimum period depends on the communication processes and systems. A speech signal is transferred via a speech line by a carrier ON/OFF process in which one sound continues in the order of 10 ms. The minimum period is set equal to such a sound continuation time. In this case, it is enough for the oscillator 71 to generate a frequency of approximately 1 kHz. In the TDMA system, the minimum period corresponds to one frame (in the order of 1 ms). In this case, the oscillator 71 must generate a frequency of about 100 kHz.

Figure 7:
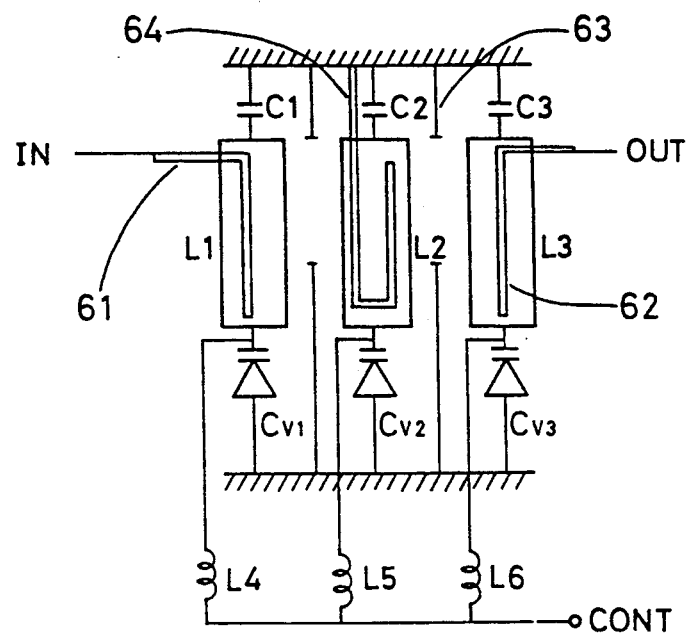
FIG. 7 is a diagram of a bandpass filter shown in FIG. 3.

FIG. 7 shows an example of the bandpass filter 6 shown in FIGS. 2 and 3. The filter shown in FIG. 7 comprises an input terminal IN, an output terminal OUT, a control terminal CONT, an input coupling unit 61, an output coupling unit 62, metal shield plates 63, a filter characteristic adjustment unit 64, varactor diodes CV1, CV2 and CV3, and inductors L1-L6. The input terminal IN is connected to the hybrid circuit 3, and the output terminal OUT is connected to the detector 8.

The sweep control signal generated by the sweep control signal generator 7 is applied to the control terminal CONT. The capacitance values of the varactor diodes CV1-CV3 by the sweep control signal applied to the control terminal CONT.

Figure 8:
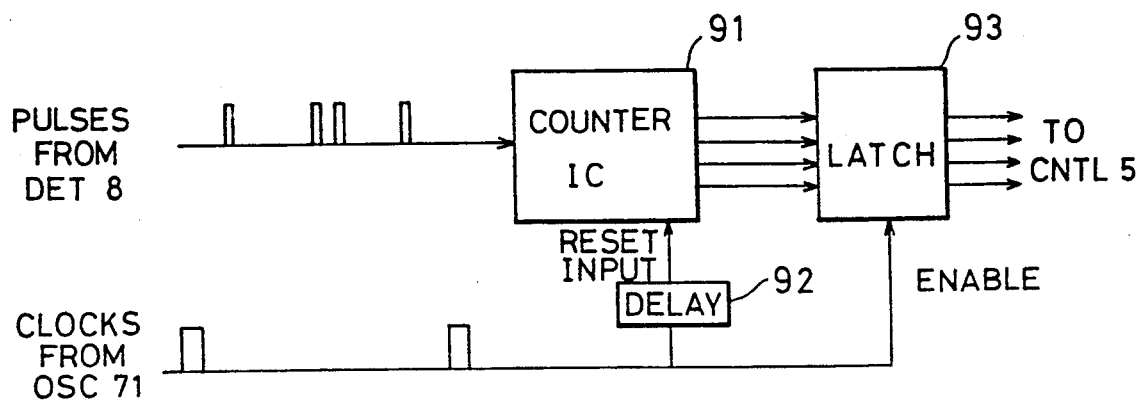
FIG. 8 is a block diagram of a counter shown in FIG. 3.

FIG. 8 shows an example of the counter 9 shown in FIGS. 2 and 3. The counter 9 comprises a counter IC 91, a delay circuit 92 and a latch circuit 93. The counter IC 91 receives the pulses from the amplifier 81 shown in FIG. 3. The rectangular pulses generated by the oscillator 71 shown in FIG. 3 are applied to the delay circuit 92 and the latch circuit 93. The delayed rectangular pulses are applied, as reset pulses, to the counter 91. The counter 91 counts the number of pulses during the interval between the two consecutive delayed rectangular pulses. The number of pulses counted by the counter IC 91 is latched in the latch circuit 93, and then output to the control circuit 5 in response to the rectangular clock generated by the oscillator 71.

Figure 9:
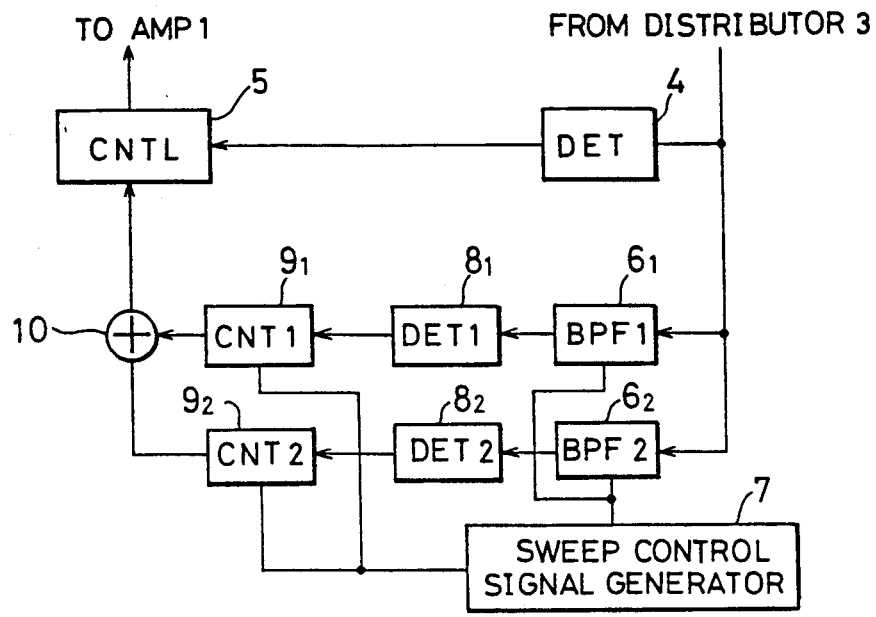
FIG. 9 is a block diagram of a second embodiment of the present invention.

FIG. 9 shows an essential part of a second embodiment of the present invention. In FIG. 9, parts which are the same as those shown in the previous figures are given the same reference numerals. In the second embodiment of the present invention, the sweep range of the bandpass filter 6 is divided into two sweep ranges. As shown in FIG. 9, the second embodiment of the present invention comprises two bandpass filters (BPF1 and BPF2) 61 and 62, two detectors (DET1 and DET2) $8_1$ and $8_2$, two counters (CNT1 and CNT2) $9_1$ and $9_2$, and an adder 10. The bandpass filter $6_1$ sweeps its bandpass range within a first half of the sweep range of the bandpass filter 6 shown in FIG. 2 or FIG. 3. The bandpass filter $6_2$ sweeps its bandpass range within a second half of the sweep range of the bandpass filter 6. Each of the bandpass filters $6_1$ and $6_2$ is configured as shown in FIG. 7. Of course, the parameter values of the bandpass filters $6_1$ and $6_2$ are different from each other in order to define the different bandpass range.

Each of the detectors $8_1$ and $8_2$ has the same structure as thee detector 8 shown in FIG. 2 or FIG. 3. Each of the counters $9_1$ and $9_2$2 is configured as shown in FIG. 8. The output signal of the counter $9_1$ shows the number of carriers within the first half of the sweep range. The output signal of the counter $9_2$ shows the number of carriers within the second half of the sweep range. The output signals of the counters $9_1$ and $9_2$ are added, and a resultant signal indicating the total number of carriers in the full sweep range is applied to the control circuit 5.

According to the second embodiment of the present invention, it becomes possible to control the transmission power level at a higher speed. Further, the sweeping speed of the each of the bandpass filters $6_1$ and $6_2$ may be approximately half that of the bandpass filter 6 shown in FIG. 2 or FIG. 3. Hence, the bandpass filters $6_1$ and $6_2$ can be more easily produced than the bandpass filter 6. It is also possible to divide the entire sweep range into three or more ranges.

A description will now be given of a third embodiment of the present invention with reference to FIG. 10, in which those parts which are the same as those shown in the previous figures are given the same reference numerals. The control circuit 5 is controlled by a mixer (MIX) 13, a bandpass filter (BPF) 6A, a sweep signal generator (GEN) 7A, the detector (DET) 8, and the counter (CNT) 9. The sweep signal control generator 7A generates a sweep signal (local signal), which has a variable frequency which is continuously changed within the transmission signal band range in which a plurality of carriers are arranged. The mixer mixes the signal from the hybrid circuit 3 with the sweep signal generated by the sweep signal generator 7A. The bandpass filter 6A has an intermediate frequency and a bandpass range equal to the carrier width, and passes only a signal component having a frequency within the bandpass range. That is, only the carriers are allowed to pass through the bandpass filter 6A. The detector 8 detects an intermediate frequency signal from the bandpass filter 6A. The output signal of the detector 8 changes by continuously changing the frequency of the sweep signal generated by the sweep signal generator 7A. That is, the detector 8 generates a DC component in the form of a pulse only when a frequency at which a carrier exists is swept. The counter 9 is reset when the sweep signal generator 7A starts the sweep operation. The counter 9 increases its count value by 1 each time the pulse generated by the detector 8 is received. At the end of the sweep period, the count number of the counter 9 is transferred to the control circuit 5.

Figure 10:
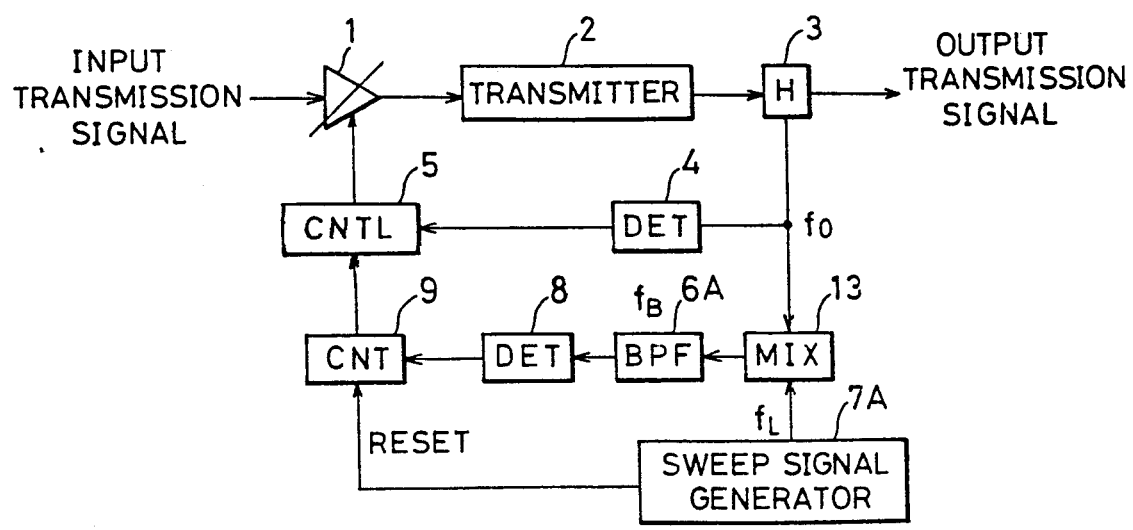
FIG. 10 is a block diagram of a third embodiment of the present invention.
Figure 11:
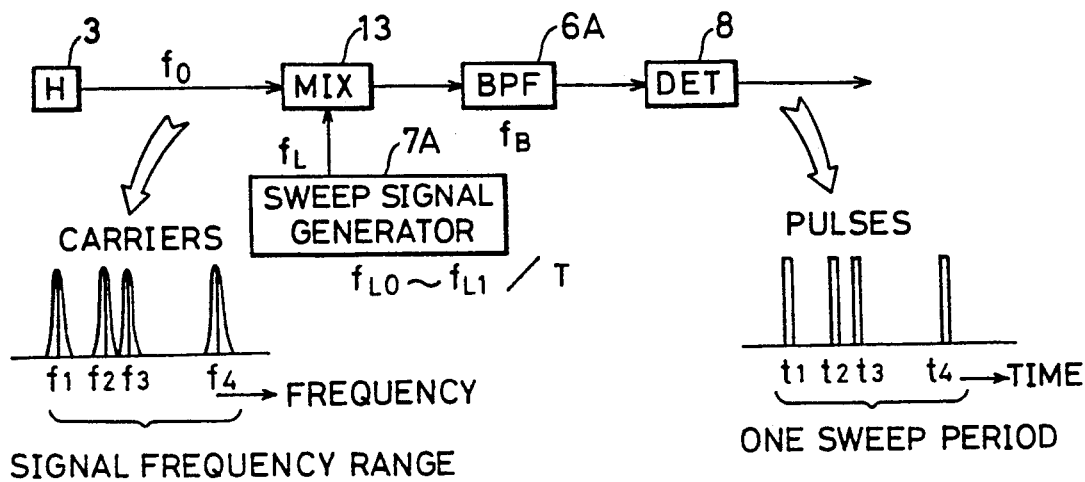
FIG. 11 is a diagram showing the operation of the third embodiment of the present invention.

FIG. 11 shows the operation of the automatic transmission level control device shown in FIG. 10. As shown in FIG. 11, in the frequency range of the transmission signal, there are four carriers having frequencies f1, f2, f3 and f4. The sweep signal generator 7A has a sweep frequency range between $f_{L0}$ and $f_{L1}$ which covers the width of a signal frequency range including the carrier frequencies f1–f4. The central frequency of the bandpass range of the bandpass filter 6A is denoted by $f_B$, and the band width $\Delta f$ is identical to the width of the carrier.

The sweep signal generator 7 generates the local (sweep) signal having a frequency which is continuously changed between $f_{L0}$ and $f_{L1}$. The mixer 6 mixes the frequency of with the frequency $f_L$, and generates a first signal having a frequency $f_0+f_L$ and a second signal having a frequency $f_0-f_{L1}$ where $f_L$ is the frequency of the local signal at a time, and fo is the frequency of a carrier signal. When the second signal becomes equal to a bandpass frequency $f_B$ of the bandpass filter 6A by sweeping the local signal, that is, $f_0-f_L=f_B$, the bandpass filter 6A passes the second signal, which is then applied to the detector 8. It will now be assumed that the carriers f1, f2, f3 and f4 respectively satisfy such a condition as described above at times t1, t2, t3 and t4 during a sweep period T, the detector 8 generates pulses respectively located at times t1, t2, t3 and t4. In the case shown in FIG. 11, the counter 9 outputs data indicating "4" equal to the number of carriers. The above-mentioned carrier detecting operation is continuously carried out during communications. A change in the number of carriers can be immediately followed, and an optimal transmission level can be determined.

Figure 12:
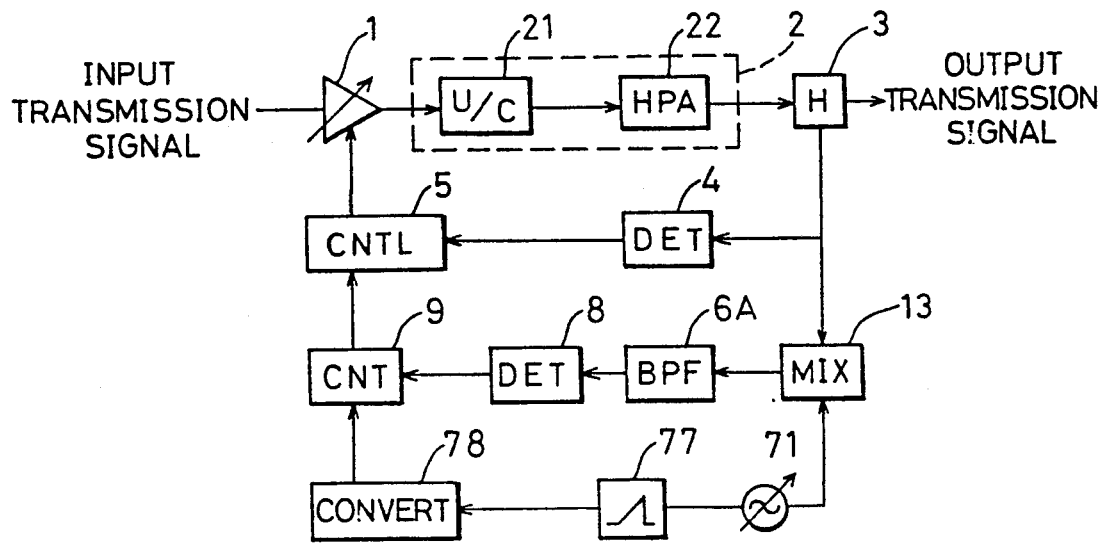
FIG. 12 is a block diagram of the third embodiment of the present invention in more detail.
Figure 13:
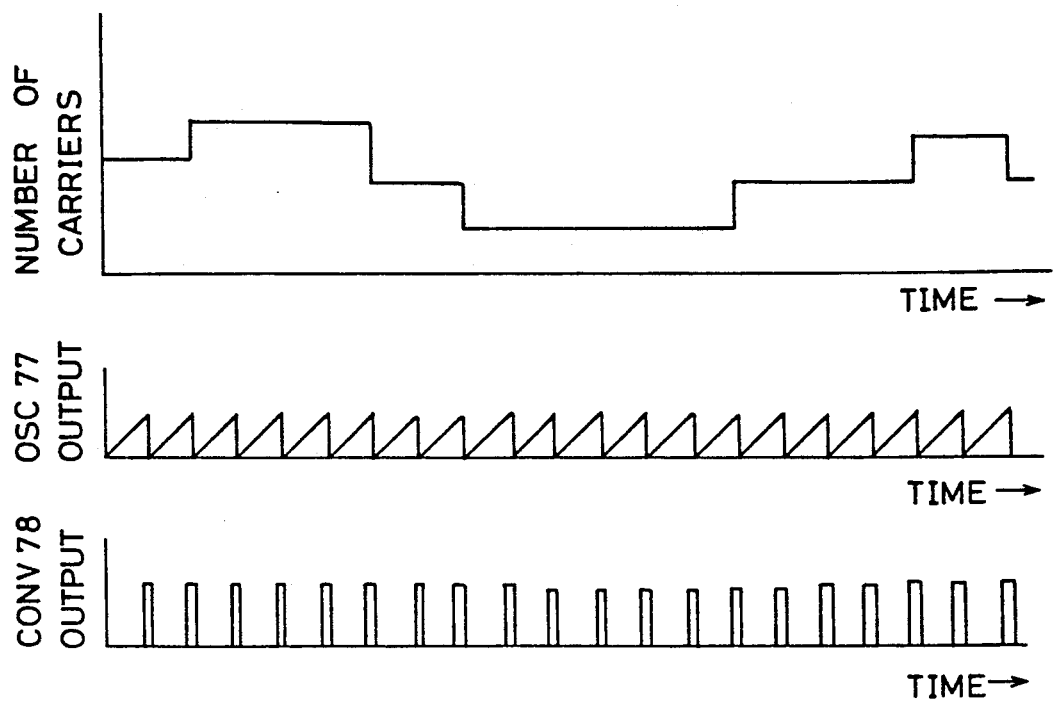
FIG. 13 is a diagram showing the operation of the structure.

FIG. 12 shows the structure of the automatic transmission level control device shown in FIG. 10 in more detail. In FIG. 12, parts which are the same as those shown in the previous figures are given the same reference numerals as in the previous figures. The sweep signal generator 7A comprises a voltage-controlled oscillator (VCO) 71, a sawtooth wave generator 77, and a conversion circuit 78, which converts a sawtooth wave generated by the sawtooth wave generator 77 into a rectangular pulse. In response to the sawtooth wave generated by the generator 77, the VCO 71 repeatedly sweeps the frequency range of the transmission signal. The conversion circuit 78 sends a one-shot pulse (rectangular wave) at the commencement of the sweep operation. Each time the pulse from the conversion circuit 78 falls, the counter 9 outputs the number of pulses stored therein to the control circuit 5, and resets the count value to zero. The control circuit 5 adjusts the reference level on the basis of the number of pulses (the number of carriers existing during the immediately previous sweep period) specified by the counter 9. FIG. 13 shows the operation of the structure shown in FIG. 12.

Figure 14:
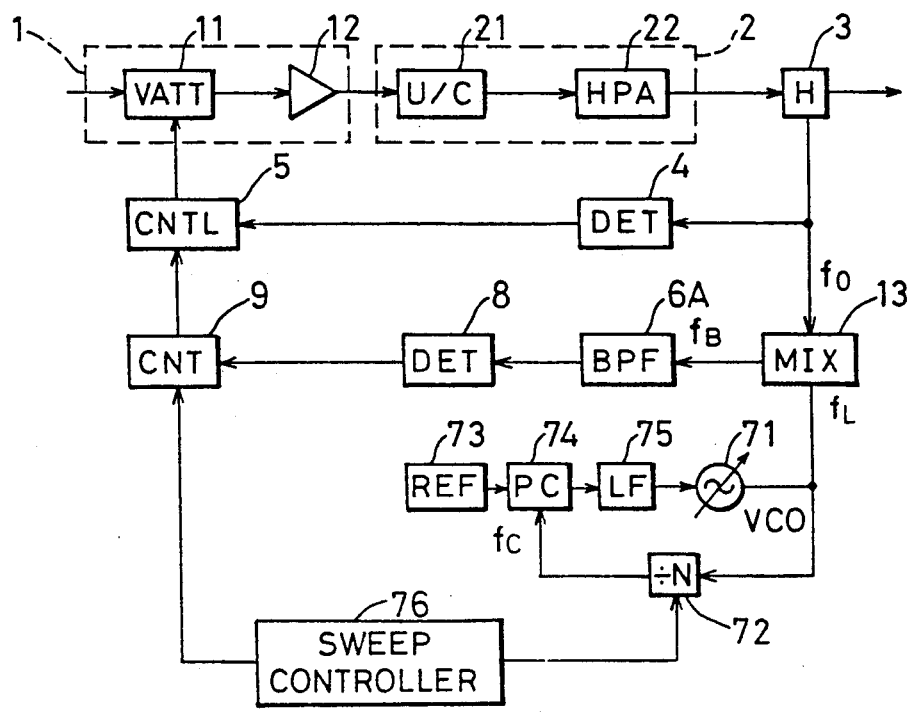
FIG. 14 is a block diagram of a fourth embodiment of the present invention.

A description will now be given of a fourth embodiment of the present invention with reference to FIG. 14, in which parts which are the same as those shown in the previous figures are given the same reference numerals. The sweep signal generator 7 used in the fourth embodiment of the present invention comprises a PLL (Phase-Locked Loop) synthesizer. As shown in FIG. 14, the PLL synthesize comprises the VCO 71, a frequency divider 72, a reference signal generator (REF) 73, a phase comparator (PC) 74, and a loop filter (LF) 75. The local signal generated by the PLL synthesizer is swept by changing the number of frequency divisions N in response to a sweep signal generated by a sweep controller 76. In this structure, the following relationships must be satisfied:

$$f_C = [\text{carrier frequency interval}] \times (1/n)$$
$$f_0 - f_L = f_B$$

where $f_C$ is the phase comparison frequency of the PLL, $f_L$ is the local oscillation frequency of the PLL output, and $f_B$ is the bandpass frequency of the bandpass filter 6A. When the above formulas are satisfied, the same effects as those in the aforementioned analog sweep operation can be obtained. The sweep controller 76 gradually increases from a smallest number of frequency divisions $N_L$ to a largest number of frequency divisions $N_U$. When the largest frequency division number $N_U$ is output, the sweep controller 76 outputs a one-shot pulse to the counter 9, and is reset to $N_L$.

Figure 16A:
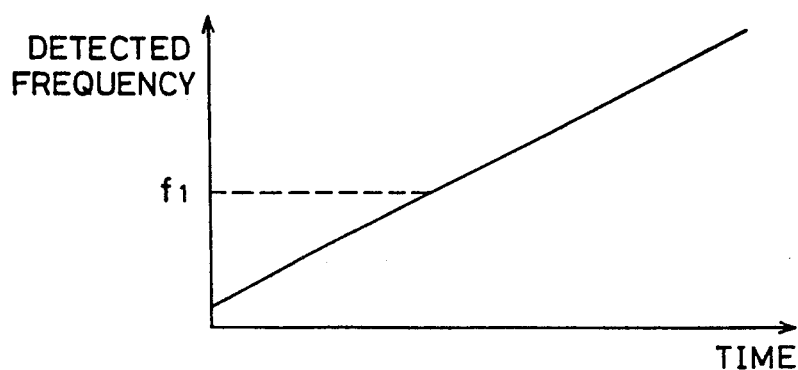
FIG. 16A is a graph showing a continuous sweep operation.
Figure 16B:
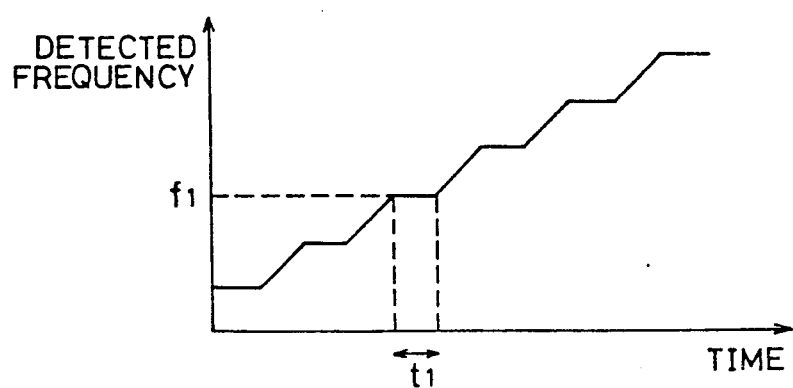
FIG. 16B is a graph showing an intermittent sweep operation.

FIG. 15 shows the operation of the circuit shown in FIG. 14. As shown in FIG. 15(b), the bandpass filter 6A detects intermittent frequencies because of use of the PLL synthesizer. By sequentially changing the frequency so as to match the minimum interval of carriers, as shown in FIG. 16B, it becomes possible to detect the carriers as in the case of the continuous sweep operation. The structure shown in FIG. 14 has a further advantage in that the carrier detection can be carried out more stably than the structure based on the continuous sweep as shown in FIG. 16A, because the sweep operation temporarily stops at the respective intermittent frequencies at which carriers are expected. Hence, the sweep operation can be executed at a speed higher than that of the other embodiments.

The structure shown in FIG. 10 can be modified in the same manner as shown in FIG. 9.

The present invention is not limited to the specifically disclosed embodiments, and variations and modifications may be made without departing from the scope of the present invention.

What is claimed is:

1. An automatic transmission level control device used in a multi-carrier communication system, comprising:
   gain control means for controlling a level of a transmission signal;
   transmission means, coupled to said gain control means for amplifying the transmission signal;

hybrid circuit means, coupled to said transmission means, for extracting a part of power of the transmission signal from said transmission means;

level control means, coupled to said gain control means and said hybrid circuit means, for adjusting a gain of said gain control means on the basis of a magnitude of the transmission signal and data indicating a number of carriers included in the transmission signal; and carrier detection means, coupled to said hybrid circuit means and said level control means, for filtering the transmission signal and for generating said data indicating the number of carriers included therein.

2. An automatic transmission level control device as claimed in claim 1, wherein said carrier detection means comprises:

bandpass filter means having a variable central frequency, for passing the transmission signal from said hybrid circuit means;

generator means, coupled to said bandpass filter means, for periodically sweeping the variable central frequency of said bandpass filter means within a predetermined frequency range in which carriers are allocated;

detector means, coupled to said bandpass filter means, for detecting a filtered transmission signal from said bandpass filter means and for generating pulses responsive to carriers included in said filtered transmission signal; and counter means, coupled to said detector means and said level control means, for counting a number of pulses generated by said detector means and for generating said data indicating the number of carriers which is equal to the number of pulses counted.

3. An automatic transmission level control device as claimed in claim 2, wherein said generator means has a sweep period equal to or shorter than a minimum period during which an identical number of carriers is maintained.

4. An automatic transmission level control device as claimed in claim 2, wherein said carrier detection means comprises reset means for resetting said counter means to an initial value each time said generator means sweeps the variable central frequency within the predetermined frequency range.

5. An automatic transmission level control device as claimed in claim 2, wherein said generator means comprises:

an oscillator generating a rectangular wave; and a sawtooth wave generator periodically generating a sawtooth wave each time said rectangular wave is applied thereto.

6. An automatic transmission level control device as claimed in claim 5, wherein:

said rectangular wave is applied, as a reset signal, to said counter means; and said counter means is reset to an initial value each time said rectangular wave is applied thereto.

7. An automatic transmission level control device as claimed in claim 1, wherein:

said carrier detector means comprises a plurality of carrier detector circuits; and wherein said carrier detector circuits respectively comprise:

bandpass filter means having respective variable central frequencies, for passing the transmission signal from said hybrid circuit means;

generator means, coupled to said respective, bandpass filter means, for periodically sweeping the variable central frequencies of said bandpass filter means;

detector means, coupled to said respective, bandpass filter means, for detecting respective filtered transmission signals from said respective bandpass filter means and for generating respective pulses responsive to carriers included in said respective filtered transmission signal;

counter means, coupled to said respective, detector means, for counting numbers of the respective pulses generated by said respective detector means; and adder means, coupled to said counter means and said level control means, for adding the numbers of the respective pulses and for generating the data indicating the number of carriers which is equal to a resultant value.

8. An automatic transmission level control device as claimed in claim 1, wherein said carrier detection means comprises:

generator means for generating a local signal for periodically sweeping a predetermined frequency range in which carriers are allocated;

mixer means, coupled to said hybrid circuit means and said generator means, for mixing the transmission signal from said hybrid circuit with said local signal and for generating intermediate frequency signals;

bandpass filter means, coupled to said mixer means, for filtering the intermediate frequency signals;

detector means, coupled to said bandpass filter means, for detecting one of the intermediate frequency signals from said bandpass filter means; and counter means, coupled to said detector means and said level control means, for counting a number of pulses included in said one of the intermediate frequency signals during a sweep period and for generating said data indicating the number of carriers which is equal to the number of pulses counted.

9. An automatic transmission level control device as claimed in claim 8, wherein said generator means comprises:

an oscillator generating a rectangular wave; and a sawtooth wave generator for generating a sawtooth wave in response to said rectangular wave, said sawtooth wave corresponding to said local signal.

10. An automatic transmission level control device as claimed in claim 8, wherein:

said generator means comprises a phase-locked loop circuit which sequentially generates intermittent frequencies one by one; and each of the intermittent frequencies corresponds to said local signal.

11. An automatic transmission level control device as claimed in claim 10, wherein a difference between two consecutive carriers among the carriers is approximately equal to a difference between two consecutive intermittent frequencies among the intermittent frequencies.

12. An automatic transmission level control device as claimed in claim 9, wherein:

said rectangular wave is applied, as a reset signal, to said counter means; and said counter means is reset to an initial value each time said rectangular wave is applied thereto.

13. An automatic transmission level control device as claimed in claim 10, wherein each of said intermittent frequencies is continuously maintained during a predetermined period.

14. An automatic transmission level control device as claimed in claim 9, wherein said sweep period is equal to or shorter than a minimum period during which an identical number of carriers is maintained.

* * * * *